United States Patent [19]
Nicolay

[11] 3,956,034
[45] May 11, 1976

[54] ISOLATED PHOTODIODE ARRAY

[75] Inventor: Hugh Crawford Nicolay, Melbourne, Fla.

[73] Assignee: Harris Corporation, Cleveland, Ohio

[22] Filed: Mar. 27, 1975

[21] Appl. No.: 562,849

Related U.S. Application Data

[62] Division of Ser. No. 380,611, July 19, 1973, Pat. No. 3,886,587.

[52] U.S. Cl. .............................. 148/175; 148/187; 357/49
[51] Int. Cl.² ........................................ H01L 21/20
[58] Field of Search .............. 148/175, 187; 357/49

[56] References Cited
UNITED STATES PATENTS

| | | |
|---|---|---|
| 3,475,661 | 10/1969 | Iwata et al. ................. 148/175 UX |
| 3,655,439 | 4/1972 | Seiter ............................... 148/175 X |
| 3,716,425 | 2/1973 | Davidsohn ......................... 148/175 |
| 3,826,699 | 7/1974 | Sawazaki et al. .................. 148/175 |

Primary Examiner—Walter R. Satterfield
Assistant Examiner—J. M. Davis
Attorney, Agent, or Firm—Leitner, Palan & Martin

[57] ABSTRACT

Low impurity concentration planar anode regions are formed without a mask in a plurality of cathode regions which are isolated from each other on their lateral edge by an insulating barrier and connected to each other by a low resistivity polycrystalline body. Metal contacts to the anode regions and the common cathode polycrystalline body are coplanar.

8 Claims, 4 Drawing Figures

ISOLATED PHOTODIODE ARRAY

This is a divisional of application Ser. No. 380,611, filed July 19, 1973 now U.S. Pat. No. 3,886,587.

BACKGROUND OF THE INVENTION

1. Field of the Invention

The present invention relates generally to photodiode arrays and more particularly to integrated photodiode arrays using silicon dioxide and polysilicon for photon isolation.

2. Description of the Prior Art

A major problem in the fabrication of photodiode arrays is to produce an array such that photons incident on one of the diodes does not induce some small response in the other diodes. Previous attempts to solve this problem have included wide spacing of the individual diodes in the array as well as completely isolating the individual diodes using an additional PN junction or completely enclosing the diodes by a layer of insulation. The additional process steps necessary to incorporate the two suggested isolation techniques unnecessarily increase the time and cost of photodiode array manufacture.

There has been a long-felt need in the industry to produce an isolated photodiode array wherein the isolation is achieved without greatly increasing the number of steps and cost of manufacture.

SUMMARY OF THE INVENTION

The present invention produces an isolated photodiode array wherein the individual diodes are separated by a polycrystalline substrate and include an insulating barrier along the lateral edges of the photodiode. The polycrystalline substrate has substantially high concentration of impurities and offers a low resistivity common cathode for all the diodes in the array. The metal contact to the plurality of anodes and the common cathode are coplanar. Since the polycrystalline substrate has substantially high concentration of impurities, the formation of the anode in the isolated cathode regions may be formed without a mask. The present invention forms the laterally isolated cathode regions by forming a V-shaped etching of cathode material along the [100] crystal plane, growing an oxide insulating layer, depositing a polycrystalline material, and grinding and polishing.

Accordingly, it is a principal object of the invention to provide a truly isolated photodiode array using the minimum number of steps.

Another object of the present invention is to provide a diode array isolated by a polycrystalline material which also serves as a low resistivity common cathode.

Still another object is to provdie a photodiode array having all the metal contacts coplanar.

A still further object of the invention is to provide an isolated diode array using a reduced area which decreases manufacturing costs.

DETAILED DESCRIPTION OF THE INVENTION

Figure 2:
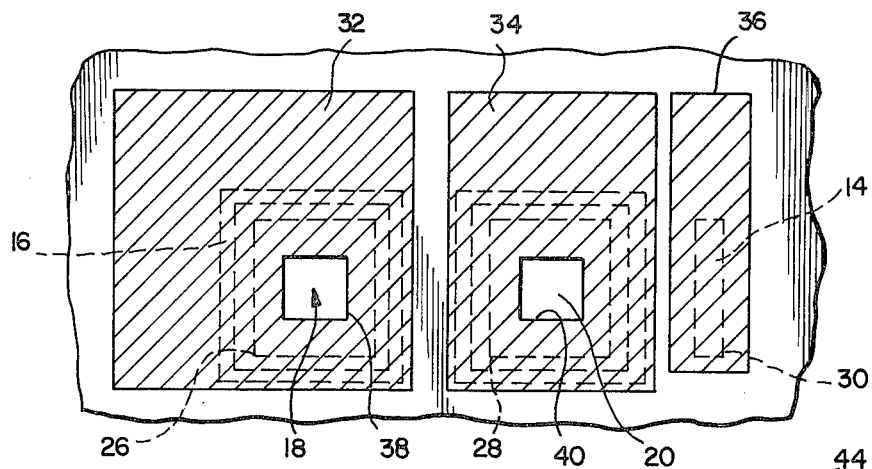
FIG. 2 is a schematic top view of the isolated photodiode array of the present invention.
Figure 1:
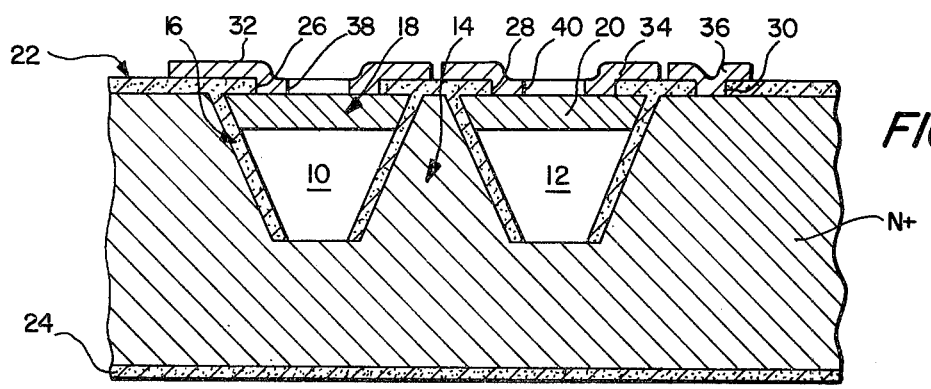
FIG. 1 is a schematic cross-sectional view of a photodiode array of the present invention.

FIG. 1 depicts an embodiment of an isolated photodiode array of the present invention having a plurality of single crystal N conductivity type regions 10 and 12 and an N+ conductivity type polycrystalline substrate 14. The N type regions 10 and 12 make contact at the bottom thereof with the polycrystalline substrate 14 and are separated from the substrate at their lateral edges by an insulating barrier 16. A diffused single crystal P conductivity type layer 18 and 20 forms within N regions 10 and 12 a PN diode junction. The top planar surface of the polycrystalline substrate 14 has an insulating layer 22 and the bottom planar surface has an insulating layer 24. Apertures 26, 28 and 30 provide access through the insulating layer 22 for metal contacts 32, 34 and 36 to anode regions 18 and 20 and common cathode region 14, respectively. Apertures 38 and 40 in metal contacts 32 and 34 define the photosensitive area of anodes 18 and 20. The relationship of the metal contacts 32 and 34 and the apertures 38 and 40 are shown specifically in the top view of the photodiode array as shown in FIG. 2.

The diodes of the array have a PN junction made of single crystal semiconductive material wherein the cathodes are connected by a common low resistivity polycrystalline semiconductive material. The lateral edges of the PN diodes are surrounded by a layer of insulating material. The polycrystalline substrate 14 and the insulating barriers 16 provide photoelectric isolation of the individual diodes. Any excess carriers created in one diode by the incident of photons thereon will recombine in that diode since it is unable to diffuse through the insulation barrier 16 and the heavily doped polycrystalline substrate 16 to other diodes in the array. Thus the response of any one diode to produce photocurrent is due only to the light falling on that diode.

Figure 3:
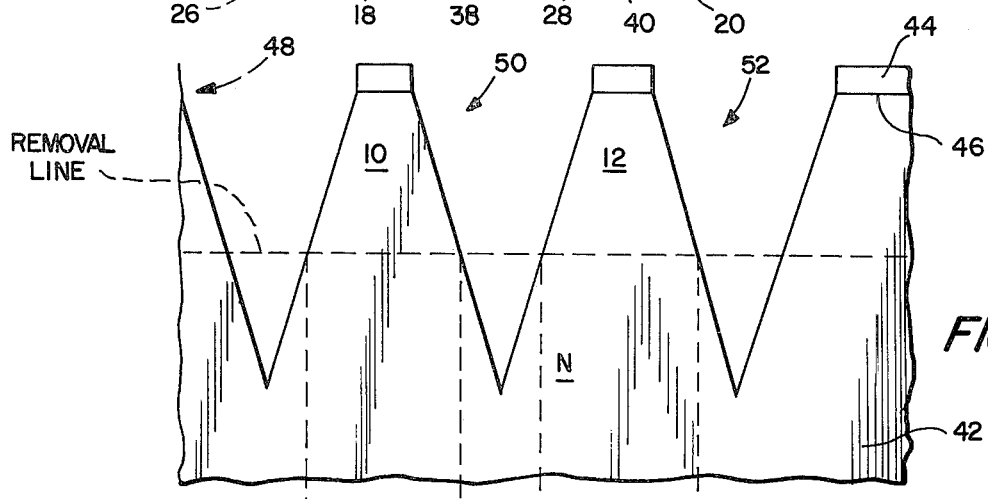
FIGS. 3 and 4 are schematic cross-sectional views of the photodiode array in consecutive stages of manufacture.

The fabrication of the isolated photodiode array begins, as illustrated in FIG. 3, with an N type wafer 42 of single crystal silicon having a thickness of 18 mils, a resistivity of approximately 5 ohm/cm and an impurity concentration of approximately $1 \times 10^{15}$ atoms/cc. The wafer 42 is cut to have a planar surface having a crystal orientation in the [100] plane. A 6000 angstrom layer of oxide 44 is grown on surface 46 in a steam ambient at 1100°C. A photoresist and oxide etch procedure is used to expose the planar surface 46 at desired locations for the deposition of polycrystalline regions 14. As is well known in this procedure, a photoresist layer is deposited on the oxide mask; the photoresist is exposed to light in accordance with the desired pattern; then the pattern is developed to remove unexposed portions of the photoresist; and thus the exposed portion of the oxide layer is removed with a suitable etchant. The remaining remaining photoresist is now removed to leave an oxide mask having windows 48, 50 and 52.

A moat etch is performed to provide a V-shaped aperture having a width of approximately 2 mils and a depth of approximately 1.4 mils with the V-shape being a result of the orientation of the [100] plane. The oxide mask 44 is removed and surface 46 is cleaned. The wafer 42 with the moats therein is again subjected to thermal oxidation for periods sufficient to form a 20,000 angstrom layer of silicon dioxide or oxide in the moats. The oxide formed on surface 46 is removed by polishing, thus leaving only an oxide insulation layer in the moats which becomes lateral insulating barriers 16 in the final embodiment.

Figure 4:
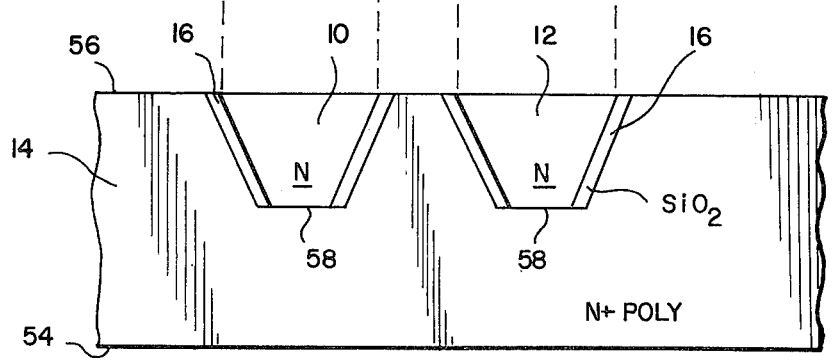

After removing the surface oxide, a polycrystalline silicon of approximately 20 mils is deposited in the moats and on planar surface 46 by chemical vapor deposition. The polysilicon is of N+ conductivity type, having a resistivity of approximately 0.0004 ohm/cm and an impurity concentration of approximately $3-8 \times 10^{20}$ atoms/cc. The polycrystalline silicon 14 is polished to produce a planar surface 54 parallel to planar surface 46. The N type silicon wafer 42 is ground and polished to the removal line shown in FIG. 3 to produce the planar surface 56 shown in FIG. 4. The photoarray at this point, as shown in FIG. 4, has N conductivity type regions 10 and 12, an N+ conductivity type polysilicon substrate 14 and insulation barriers 16 at the lateral edges of the regions 10 and 12. The single crystal N conductivity type regions make contact at bottom surfaces 58 to the high impurity concentration polycrystalline silicon substrate 14, which acts as a low resistance common cathode current path.

The wafer, as shown in FIG. 4, is then processed through a conventional open tube deposition-diffusion sequence with a P conductivity type dopant to form P type anode regions 18 and 20 having a surface resistivity of approximately 300 ohms/square and an impurity concentration of approximately $2 \times 10^{18}$ at the surface 56. The P-N junction thus formed is at a depth of $1\mu$ from the surface 56. Preferably, the P type dopant is boron, but other P type dopants such as gallium are acceptable. Since the impurity concentration of the polycrystalline silicon 14 is at least 2 orders of magnitude greater than the maximum impurity concentration of the P type diffusion or layer, and thus no net change in conductivitiy type for the polycrystalline silicon results, the deposition-diffusion is performed without an oxide mask.

During and following the diffusion of the anode regions, silicon dioxide is regrown, thereby covering the polysilicon and the anode regions with a complete oxide layer. Another photoresist and oxide etch procedure identical to that described above is performed to open windows 26, 28 and 30 for the anode and cathode contact regions. The wafer is then chemically cleaned and 1 micron of aluminum is evaporated onto the wafer surface. A final photoresist and aluminum etch is performed to define contact metals 32, 24 and 36 to anodes 18 and 20, and common cathode 16, respectively. Also produced in the aluminum etch are windows 38 and 40 which define the photosensitive region of the anodes 18 and 20.

The aluminum and silicon are alloyed at 450° for 20 minutes and then baked for 20 hours at 300° to complete the fabrication.

It will be apparent that all the N and P regions may be reversed without effecting the essence of the invention. Though the moats were formed before the P conductivity deposition and diffusion which form the P type anode regions, they may also be formed after the P type deposition.

What is claimed is:
1. A process for fabricating a radiation sensitive device which comprises:
    forming a first plurality of regions of one conductivity type at a first planar surface of a polycrystalline semiconductor of said one conductivity type;
    forming a plurality of insulating barriers separating lateral edges of said first plurality of regions and said polycrystalline semiconductor; and
    forming a second plurality of planar regions of opposite conductivity type, one at each of said first plurality of regions.
2. A process as in claim 1 wherein said polycrystalline semiconductor has substantially greater concentration of impurities than said second plurality of planar regions and said second plurality of planar regions are formed by diffusion without a mask.
3. A process as in claim 2 wherein the impurity concentration of said polycrystalline semiconductor is at least approximately 2 orders of magnitude greater than the impurity concentration of said second plurality of planar regions.
4. A process as in claim 1 including:
    forming a layer of insulation on said first planar surface with a plurality of openings over said second plurality of planar regions and an opening over a portion of said polycrystalline semiconductor; and
    forming a first plurality of conductors extending through said plurality of openings into contact with said second plurality of planar regions and a second conductor extending through said opening into contact with said polycrystalline semiconductor.
5. A process as in claim 4 wherein said first plurality of regions have a substantially greater resistivity than said polycrystalline semiconductor which provides a common low resistance current path from said second conductor to said first plurality of regions.
6. A process as in claim 5 wherein the resistivity of said first plurality of regions is at least approximately 5 orders of magnitude greater than the resistivity of said polycrystalline semiconductor.
7. A process as in claim 1 wherein said first plurality of regions and said plurality of insulating barriers are formed by:
    forming a plurality of channels in a single crystal body of said one conductivity type having a second planar surface;
    forming said insulating barriers only on the lateral edges of said plurality of channels;
    filing said channels and covering said second planar surface with said polycrystalline semiconductor; and
    removing a portion of said single crystal body and said polycrystalline filed channels to form said first planar surface with said first plurality of regions of one conductivity type.
8. A process as in claim 7 wherein said channels are V-shaped and are formed by etching along [100] crystal planes.

* * * * *